United States Patent
Wageman et al.

(10) Patent No.: US 6,517,658 B1
(45) Date of Patent: Feb. 11, 2003

(54) FIBER-RESIN COMPOSITE BODY FOR PROVIDING ELECTROMAGNETIC SHIELDING, COMPRISING AN ELECTRICAL CONTACT STRIP, AND METHOD FOR MAKING SAME

(75) Inventors: Franciscus Gerhardus J. Wageman, Hengelo (NL); Eric André Kappel, Hengelo (NL)

(73) Assignee: Thales Nederland B.V., Hengelo (NL)

(*) Notice: Subject to any disclaimer, the term of this patent is extended or adjusted under 35 U.S.C. 154(b) by 0 days.

(21) Appl. No.: 09/508,081

(22) PCT Filed: Sep. 2, 1998

(86) PCT No.: PCT/EP98/05712
§ 371 (c)(1),
(2), (4) Date: Mar. 13, 2000

(87) PCT Pub. No.: WO99/12727
PCT Pub. Date: Mar. 18, 1999

(30) Foreign Application Priority Data

Sep. 11, 1997 (NL) ............................................. 1007018

(51) Int. Cl.⁷ ......................... B32B 31/20; B29C 70/88; H05K 9/00
(52) U.S. Cl. ...................... 156/247; 156/245; 156/286; 156/307.7; 156/323; 264/241; 264/258
(58) Field of Search ................................. 156/245, 247, 156/307.7, 323, 286; 264/101, 102, 241, 257, 258

(56) References Cited

U.S. PATENT DOCUMENTS

| 4,486,490 A | * | 12/1984 | Patz et al. |
| 4,554,204 A | * | 11/1985 | Ono et al. |
| 4,681,718 A | * | 7/1987 | Oldham |
| 4,746,389 A | * | 5/1988 | DiGenova ................... 156/247 |
| 5,250,342 A | * | 10/1993 | Lang et al. |
| 5,698,316 A | * | 12/1997 | Kuras et al. |
| 5,869,412 A | * | 2/1999 | Yenni, Jr. et al. |
| 5,939,013 A | * | 8/1999 | Han et al. |
| 6,398,899 B1 | * | 6/2002 | Umezawa et al. |

FOREIGN PATENT DOCUMENTS

| EP | 0 014 491 | * | 8/1980 |
| EP | 0 022 919 | * | 1/1981 |
| EP | 0 399 944 | * | 11/1990 |

* cited by examiner

*Primary Examiner*—Curtis Mayes
(74) *Attorney, Agent, or Firm*—Oblon, Spivak, McClelland, Maier & Neustadt, P.C.

(57) ABSTRACT

A method for fabricating a fiber-resin composite body for providing electromagnetic shielding. The body has a resin-impregnated fiber fabric and an electrically conductive fiber fabric, wholly or partially impregnated with resin material, one surface of the conductive fiber fabric having an uninsulated area wholly or partly covered with an electrical contact strip made of a wire mesh, which provides an electrical connection with the electrically conductive fiber fabric. The method includes placing the electrically conductive fiber fabric and the resin-impregnated fiber fabric in a mold, placing the wire mesh of the contact strip directly on the electrically conductive fiber fabric, covering the wire mesh of the contact strip with a sealing tape, and filling up the wire mesh of the contact strip completely with uncured resin material from the resin-impregnated fiber fabric so that only a front side thereof forms a contact surface free of resin. The method also subsequently cures the uncured resin and removes the sealing tape after the curing step has at least substantially ended.

6 Claims, 4 Drawing Sheets

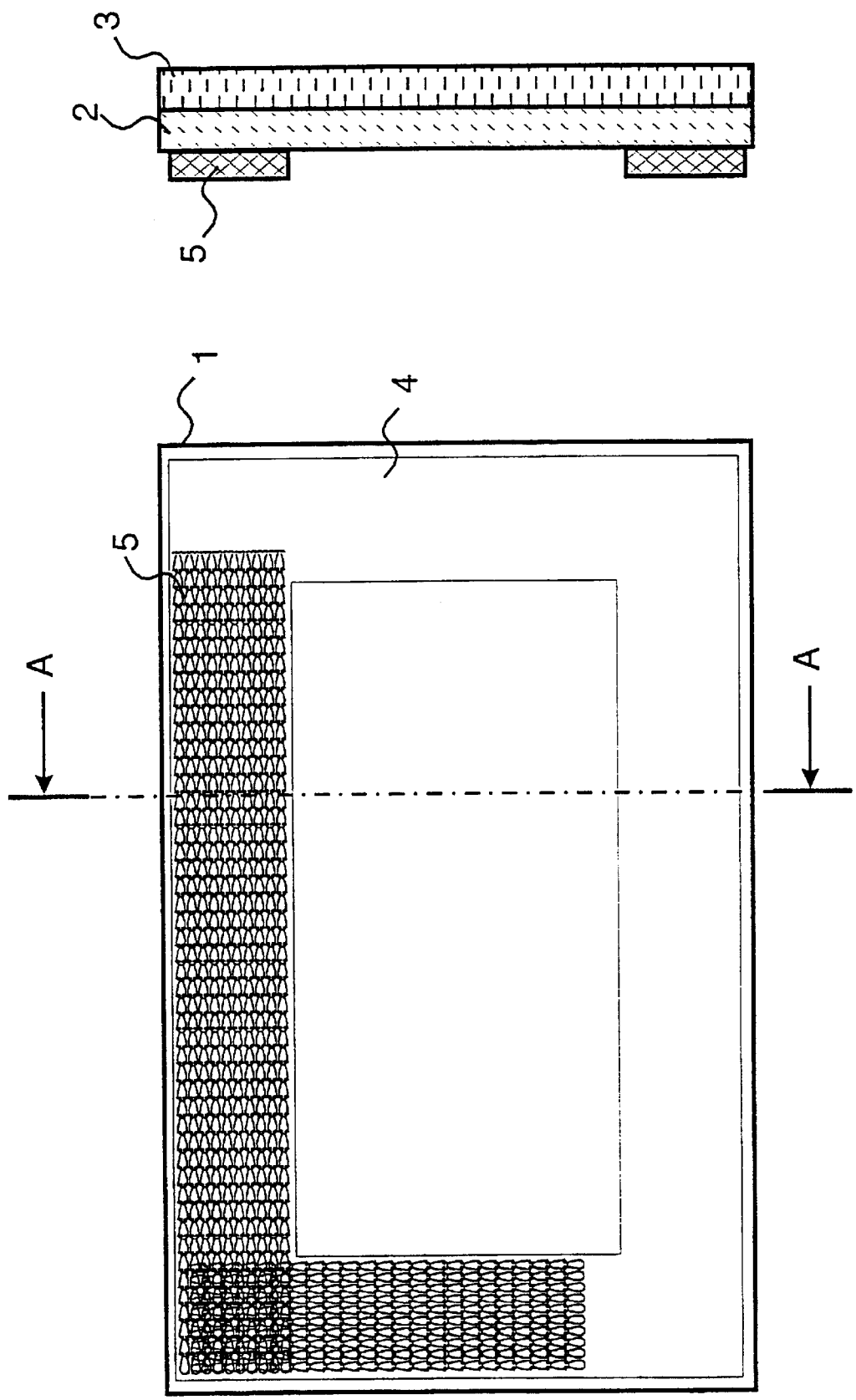

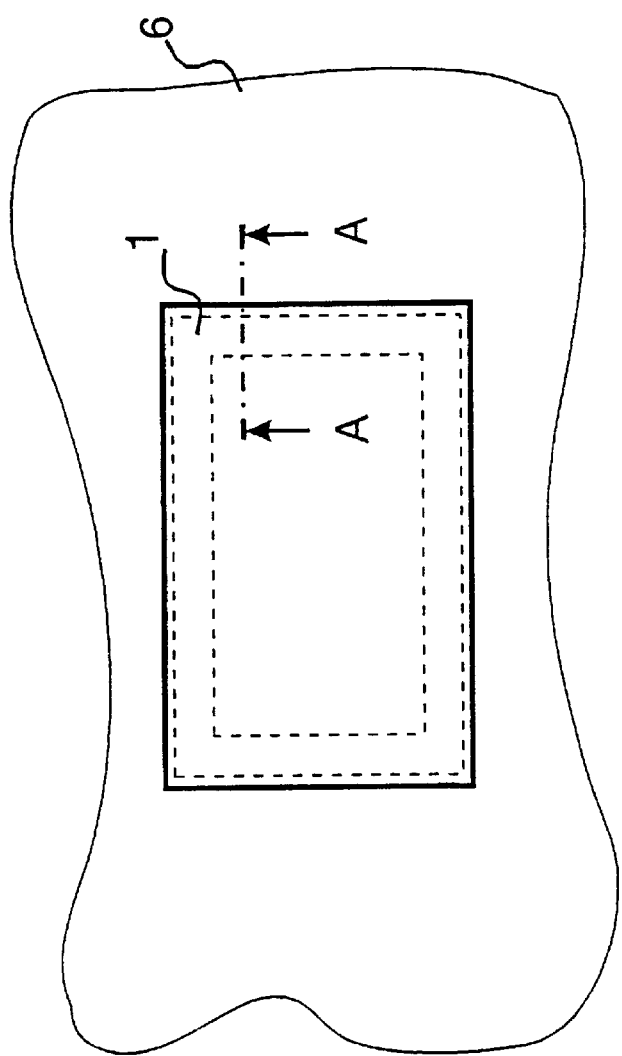
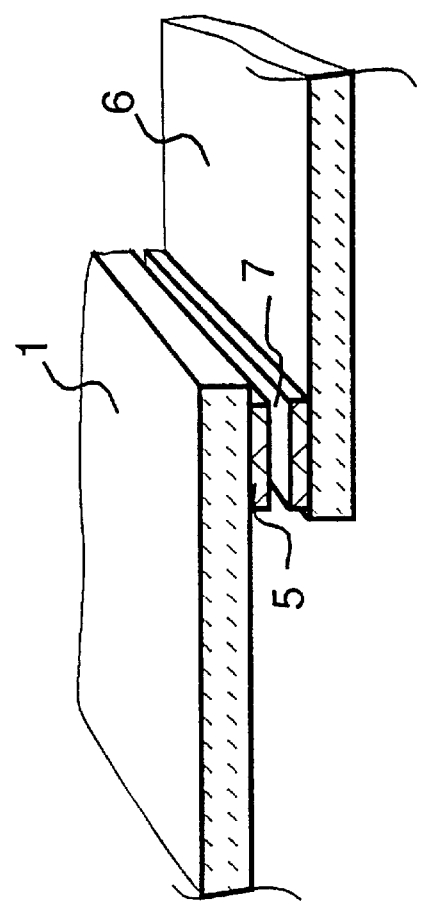
FIG 2A
FIG 2B

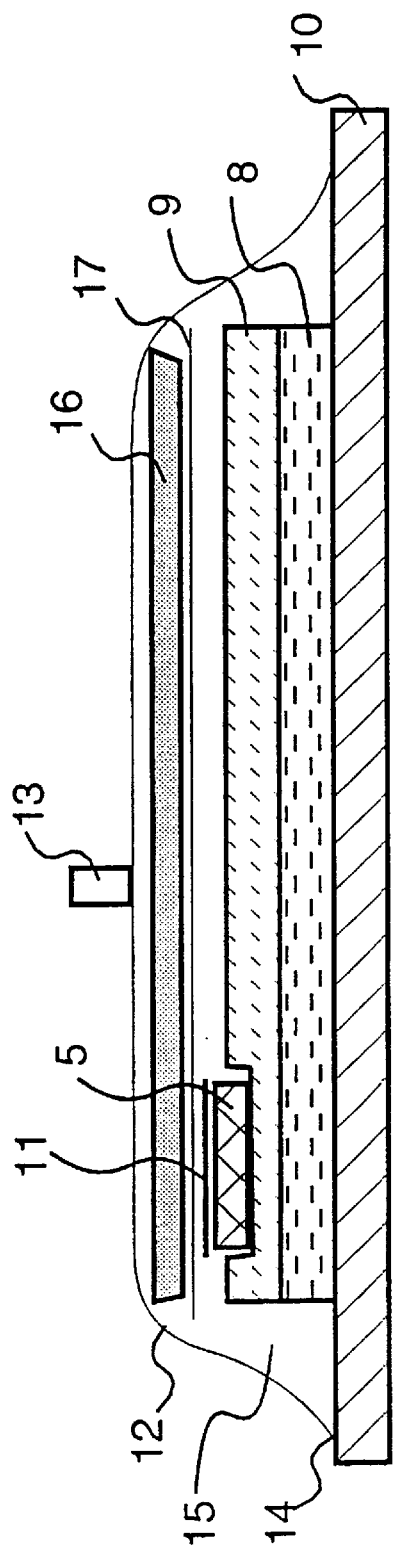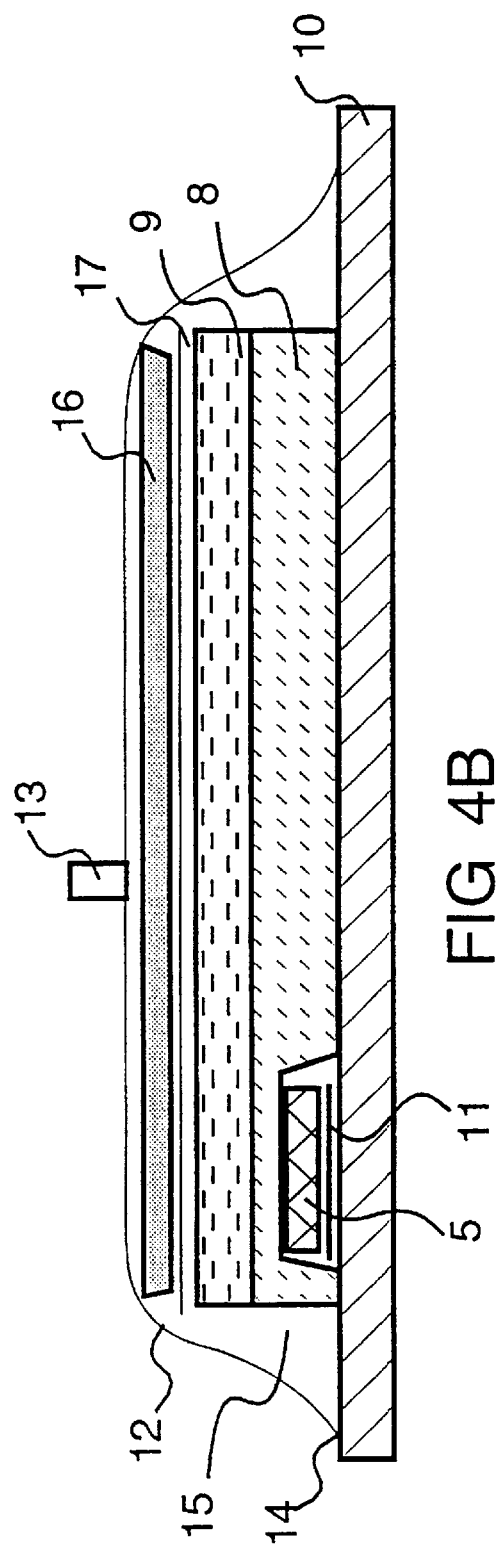

FIBER-RESIN COMPOSITE BODY FOR PROVIDING ELECTROMAGNETIC SHIELDING, COMPRISING AN ELECTRICAL CONTACT STRIP, AND METHOD FOR MAKING SAME

BACKGROUND OF THE INVENTION

The invention relates to a fibre-resin composite body for providing electromagnetic shielding, at least comprising an electrically conductive fibre fabric, partially or wholly embedded in the fibre-resin material.

DESCRIPTION OF THE RELATED ART

The electrically conductive layer in a body of this type creates the possibility to provide electromagnetic shielding notwithstanding the fact that low-conductive composite materials are utilized. The body may, for instance, be implemented as a cover plate or protective hood. If the body in question is implemented as a protective hood, it is suitable for shielding parts susceptible to electromagnetic radiation or parts emitting undesirable electromagnetic radiation in, for instance, a radar apparatus. In certain types of radar apparatus it is required to provide adequate electromagnetic shielding within overlap areas between the protecting hood and adjacent units. If prior art protective hoods are applied, this shielding does not provide a sufficient degree of shielding, since electromagnetic radiation may leak out through the lap joint.

SUMMARY OF THE INVENTION

The body according to the invention aims at enhancing the prior art body and is thereto characterized in that one surface of the body has an insulated and an uninsulated area, the latter area being wholly or partially covered with an electrically conductive contact strip which provides a direct electrical connection with the conductive fibre fabric. Thus, direct electrical contact can be established between the protective covering and adjacent units, resulting in a local strong electromagnetic shielding.

An advantageous embodiment is characterized in that the conductive strip comprises a wire mesh. This entails the advantage that lamination of the strip can be included in the overall lamination process.

The invention additionally relates to a method for fabricating a fibre-resin composite body for providing electromagnetic shielding, at least comprising an electrically conductive fibre fabric, wholly or partially embedded in the fibre-resin material, said body comprising on one surface thereof an insulated area and an uninsulated area, the latter area being wholly or partially covered with an electrically conductive contact strip which provides a direct electrical connection with the conductive fibre fabric, said method comprising the steps of:

placing the fibre fabric with the non-cured resin in the mould;

placing the conductive contact strip on the electrically conductive fibre fabric;

covering the electrically conductive contact strip or a part thereof with a sealing tape;

subsequent curing of the resin;

removing the sealing tape after the cure cycle has at least substantially expired.

In actual practice, the construction of a fibre-resin composite protective hood or plate comprising a conductive layer and a contact strip for providing direct electrical connection with the conductive layer, has proven to be quite complex. In this context, an obvious fabrication method would be to remove resin caused by lamination from the area that is to accommodate the contact strip and to apply the contact strip after lamination. The advantage of the method according to the invention is, however, that lamination of the contact strip is included in the overall lamination process, which obviates the need for the above-described operations.

By preference, the method is effected such that during the cure cycle, an external pressure force is exerted on the body such that a compact structure is obtained. Preferably prior to curing, the body to be moulded is hermetically sealed by means of a foil after which the space that contains the body to be moulded, is at least substantially evacuated, resulting in an even distribution of pressure on the body.

The conductive fibre fabric is by preference laminated along with a resin-impregnated fibre fabric, a so-called prepreg which is commercially available. During the curing process under a vacuum, the non-cured resin is also found to infiltrate the conductive fibre fabric.

If the contact strip comprises a wire mesh, a good electrical contact with the conductive layer is ensured during lamination. The vacuum process will cause the mesh to be pressed firmly against the electrically conductive layer, while the non-cured resin will be pressed between the filaments of the mesh, so that the mesh is bonded to the conductive layer. The sealing foil or tape is pressed firmly against the side of the contact strip that is to remain uninsulated so as to prevent resin inclusion during the curing cycle.

If the sealing tape is made of a silicone-based material, it can be easily removed after the lamination process.

The above-described process can take place during a low-temperature curing cycle.

BRIEF DESCRIPTION OF THE DRAWINGS

The body according to the invention will now be described in greater detail with reference to the following figures, of which:

FIGS. 1A and 1B illustrate an embodiment of the body according to the invention;

FIGS. 2A and 2B illustrate the body according to the invention in a position of use;

FIGS. 4A and 4B are cross-sectional views of the body according to the invention during the lamination process.

DETAILED DESCRIPTION OF THE INVENTION

Figure 3:
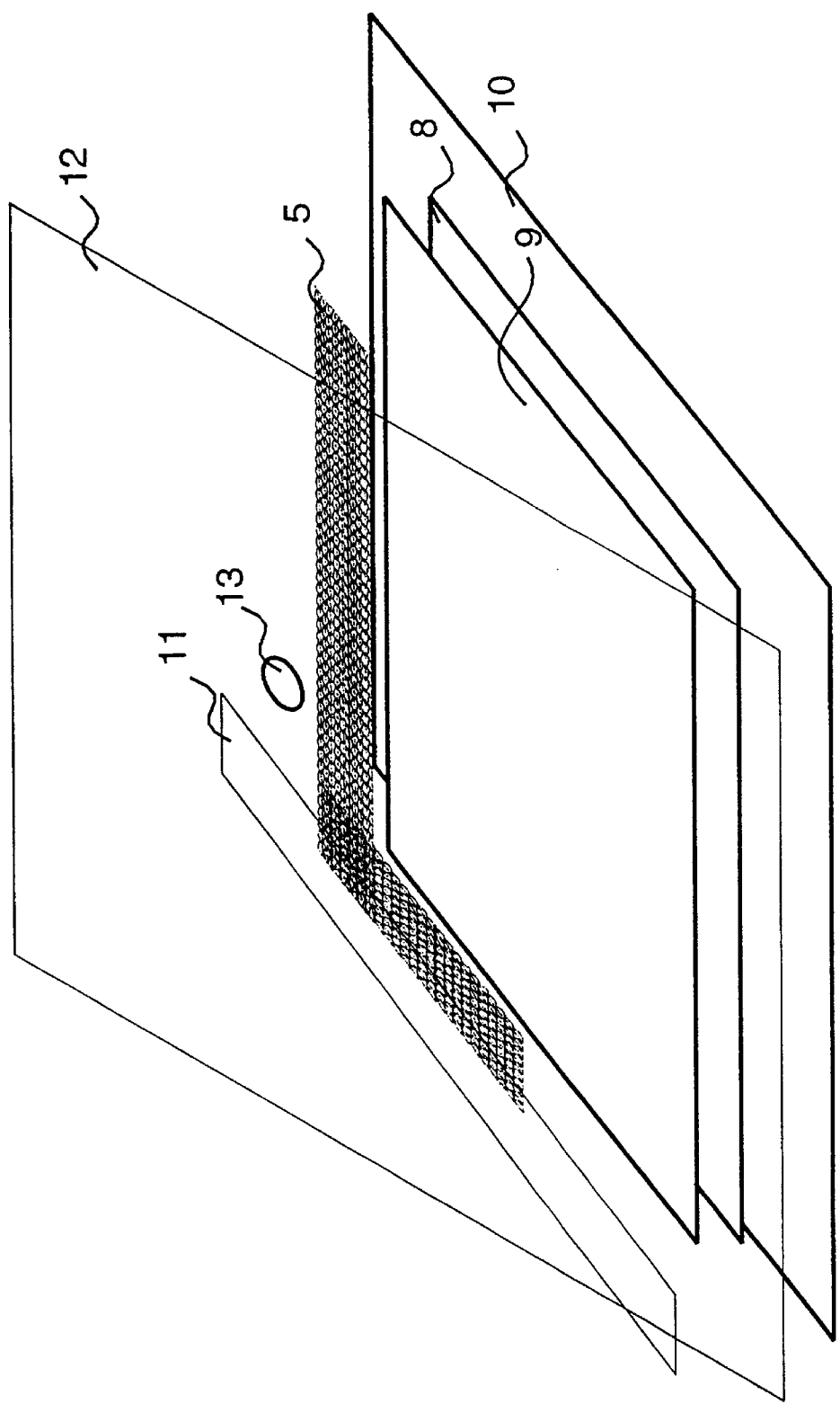
FIG. 3 illustrates the body according to the invention during fabrication.

FIGS. 1A and 1B illustrate an embodiment of the body according to the invention in bottom view and cross-sectional view A—A respectively. In this embodiment, the body is implemented as a rectangular cover plate 1, for instance suitable as an access panel in a radar apparatus. The cover plate is composed of a fibre-resin composite material and comprises a first fibre fabric 2 and a second prepreg fibre fabric 3, which are jointly laminated. The fibre fabrics may be of the woven or non-woven type. The first fibre fabric 2 comprises a metal film, for instance copper, to provide electromagnetic shielding. The cover plate 1 is fully insulated, except for an area 4 along the edges of the cover plate. This strip is covered with a contact strip 5, implemented as wire mesh, partially shown in the figure, which provides an electrical connection with the conductive fibre fabric. Another possibility is to apply a metal massive strip. In this case, however, the electrical conduction between the metal strip and the conductive layer will not be optimal. The advantage of wire mesh on the other hand is that it allows the penetration of non-cured resin, so that it can be easily included in the lamination process. This ensures a good conductivity between the strip and the electrically conductive fibre fabric, since the individual filaments of the mesh are in contact with the fabric. An incidental advantage is that the extra step in the fabrication process which involves the placement of a strip after lamination, can be left out.

FIGS. 2A and 2B show the cover plate of FIG. 1 in a position of use. The cover plate is mounted on a wall 6 of a cabinet containing equipment units requiring electromagnetic shielding. In the exemplifying figure, the wall itself is also made of a fibre-resin composite covered with a conductive layer, also comprising an electrical contact strip which forms an electrical connection with the conductive layer. The wall may, however, also be composed of metal, aluminium for instance. FIG. 2B which represents cross-section A—A from FIG. 2A, reveals that the contact strips 5 and 7 of cover plate 1 and wall 6 are superimposed, which prevents electromagnetic energy from entering the cabinet through the lap joint. The cover plate and the wall now form a continuous conductive shield.

FIG. 3 illustrates how the electrically conductive contact strip 5 can be included in the lamination process. To this end, a resin-impregnated fibre fabric 8 is placed, jointly with an electrically conductive fibre fabric 9 in a mould 10, to which a coating of release agent has been applied, for instance wax or a Teflon coating. If necessary, several fibre fabrics may be included in one lamination process, depending on the required thickness of the laminate. A contact strip 5 is subsequently placed on a border section. To keep the upper surface of the contact strip, which is to remain uninsulated, resin free, contact strip 5 is during lamination covered with a strip of silicone tape 11 or any other removable tape. The assembly is wrapped in a plastic foil 12, which is provided with a nipple 13. A vacuum hose is connected to the nipple after which the foil-wrapped assembly is evacuated. Owing to the resulting high external pressure, the laminate is moulded; the non-cured resin in the prepreg is pressed into the voids of the conductive fibre fabric and the contact strip. The external pressure also causes the contact strip 5 implemented as a metal mesh to be firmly pressed against the conductive fibre fabric 9, resulting in a good electrical conductivity. Subsequently, the resin is cured at the relatively low temperature of about 50° C. After the cure cycle, the silicone tape 11 is removed. If required, the assembly is postcured at temperatures ranging from 120° C. to 180° C. The above process has turned out a laminate which is on all sides insulated by the fibre-resin material, except at the position of the contact strip 5.

FIGS. 4A and 4B are cross-sectional views of the body according to the invention during fabrication. Corresponding parts from FIG. 3 are equally numbered. FIG. 4A shows that a prepreg 8 is placed on the mould 10. The prepreg is overlaid with the conductive fibre fabric 9 and contact strip 5 which, owing to the external pressure, causes a slight depression in conductive fibre fabric 9. The contact strip 5 is overlaid by tape 11. The body to be moulded is hermetically sealed in foil 12 which is secured to the mould 10 by means of a rubber substance. The space 15 that contains the body is then evacuated via nipple 13. To ensure a smooth evacuation process, a so-called "breather cloth" 16, made from an air-permeable material such as flannel, is placed over the body along with a porous cellophane 17 to prevent the breather cloth 16 from sticking to the body, so that it can be easily removed after fabrication.

FIG. 4B shows that the contact strip 5, provided with sealing tape 11, and the conductive fibre fabric 9 may also abut against the mould 10 so that, on this side, a smooth surface is obtained.

The above-described process can also be performed with a pre-impregnated electrically conductive fibre fabric without any additional fibre fabrics, if an extremely thin laminate is required. Apart from the flat plate structure, the mould 10 may have any other form required to realize a hood construction.

What is claimed is:

1. A method for fabricating a fiber-resin composite body for providing electromagnetic shielding, said body having a resin-impregnated fiber fabric and an electrically conductive fiber fabric, wholly or partially impregnated with resin material, one surface of the conductive fiber fabric having an uninsulated area, said uninsulated area being wholly or partly covered with an electrical contact strip made of a wire mesh, which provides an electrical connection with the electrically conductive fiber fabric, said method comprising the steps of:

placing the electrically conductive fiber fabric and the resin-impregnated fiber fabric in a mold;

placing the wire mesh of the contact strip directly on the electrically conductive fiber fabric;

covering the wire mesh of the contact strip with a sealing tape;

filling up the wire mesh of the contact strip completely with uncured resin material from the resin-impregnated fiber fabric so that only a front side thereof forms a contact surface free of resin;

subsequently curing the uncured resin; and removing the sealing tape after the curing step has at least substantially ended.

2. The method as recited in claim 1, wherein, during the curing step, an external pressure force is exerted on the body.

3. The method as recited in claim 2, wherein prior to the filling step, the body to be molded is hermetically sealed by a foil after which a space that contains the body to be molded is at least substantially evacuated.

4. The method as recited in claim 1, wherein the conductive fiber fabric, placed in the mold, overlays an additional fiber fabric.

5. The method as recited in claim 1, wherein the sealing tape is made of a silicone-based material.

6. The method as recited in claim 1, wherein the curing step is performed at about 50° C.

* * * * *